United States Patent [19]
Park

[11] Patent Number: 5,960,320
[45] Date of Patent: Sep. 28, 1999

[54] METAL WIRING LAYER FORMING METHOD FOR SEMICONDUCTOR DEVICE

[75] Inventor: Chang-soo Park, Suwon, Rep. of Korea

[73] Assignee: Samsung Electronics Co., Ltd., Rep. of Korea

[21] Appl. No.: 08/610,442

[22] Filed: Mar. 4, 1996

[30] Foreign Application Priority Data

Mar. 3, 1995 [KR] Rep. of Korea .......................... 95-4381

[51] Int. Cl.[6] .................................................. H01L 21/44
[52] U.S. Cl. .......................... 438/688; 438/660; 438/672; 438/680; 438/685
[58] Field of Search .................................. 438/256, 399, 438/571, 598, 660, 669, 696, 699, 680, 672, 688, 683, 685

[56] References Cited

U.S. PATENT DOCUMENTS

| | | | |
|---|---|---|---|
| 5,486,492 | 1/1996 | Yamamoto et al. | 438/629 |
| 5,591,302 | 1/1997 | Shinohara et al. | 156/661.11 |
| 5,702,982 | 12/1997 | Lee et al. | 437/195 |
| 5,705,430 | 1/1998 | Avanzino et al. | 437/195 |

*Primary Examiner*—Chandra Chaudhari
*Assistant Examiner*—Reneé R. Berry
*Attorney, Agent, or Firm*—Myers Bigel Sibley & Sajovec

[57] ABSTRACT

A silicon semiconductor device has at least one contact plug of chemical-vapor-deposited aluminum to a lower-level titanium contact provided with a titanium nitride layer that is a barrier both to the migration of aluminum and to the migration of silicon layer, but is treated so as to be smooth and titanium-rich on the surface thereof on which aluminum is chemical-vapor-deposited, so the chemical-vapor-deposited aluminum in the contact plug is homogeneously grown and free of voids therein. The silicon semiconductor device may additionally include trenches for buried aluminium wiring in the same insulating layer through which the contact hole for each contact plug extends. The preferred methods of manufacturing the device include electron-cyclotron-resonance etching, to smooth the surface of the side walls and bottoms of each contact hole and buried-aluminium-wiring trench, and to render the exposed surface titanium nitride layer titanium-rich.

31 Claims, 5 Drawing Sheets

METAL WIRING LAYER FORMING METHOD FOR SEMICONDUCTOR DEVICE

The present invention relates to a metal wiring layer forming method for a semiconductor device, and more particularly, to a metal wiring layer forming method for a semiconductor device wherein a metal contact hole is buried and a metal wire layer is formed at the same time by using chemical-vapor-deposited (CVD) aluminum.

BACKGROUND OF THE INVENTION

When the wiring structure in a semiconductor device has multiple levels, it is difficult to reduce the vertical geometrical size of a contact hole in the same ratio as the horizontal geometrical size thereof, so an increase of aspect ratio results for contact holes to lower levels of wiring or to the substrate. Accordingly, a conventional metal wire layer forming method has several problems such as a non-planarity, a poor step coverage, residual metal shorts, a low yield or a deteriorated reliability. In attempting to avoid problems with the use of aluminum for metal wire layers and contact plugs, such as problems with the migration of aluminum into silicon during subsequent high-temperature processing steps, considerable attention has been given to using refractory metals instead, such as tungsten, for forming the wire layer and contact plugs to lower levels of the multiple-level wiring.

Recently, as a new wiring technology for solving such problems, a technology for simultaneously attaining a metal contact hole filling and a metal wiring called Dual Damascene has been widely used. The Dual Damascene technology generally adopts a blanket-CVD of tungsten (W). FIGS. 1A through 1E are cross-sectional views for explaining the method for forming the semiconductor metal wiring layer according to a conventional Dual Damascene.

Figure 1A:
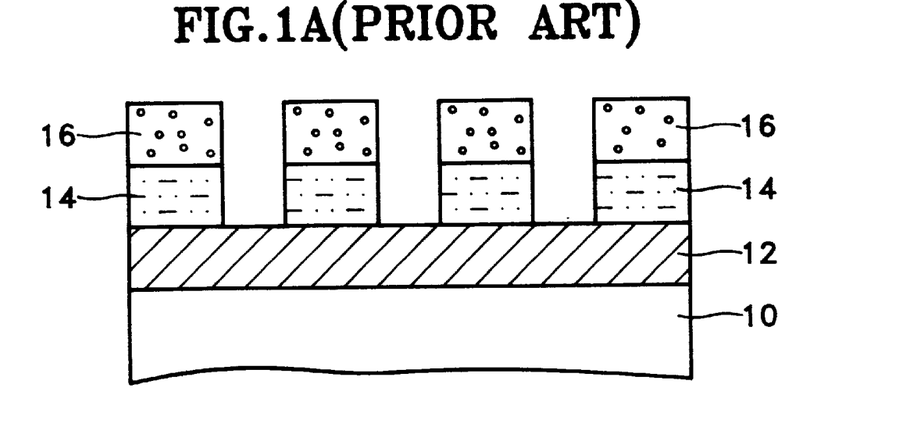
FIGS. 1A through 1E are cross-sectional views for explaining the method for forming a conventional metal wiring layer in a semiconductor device.

Referring to FIG. 1A, an insulating layer 12 is formed on a silicon substrate 10 having a step difference structure (not shown) formed therein, and then an oxide is deposited thereonto a predetermined thickness as an interlevel dielectric film 14. Subsequently, a first photoresist pattern 16 for forming a metal wiring layer is formed on the resultant structure and then the interlevel dielectric film 14 is etched using the first photoresist pattern 16 as a mask.

Figure 1B:
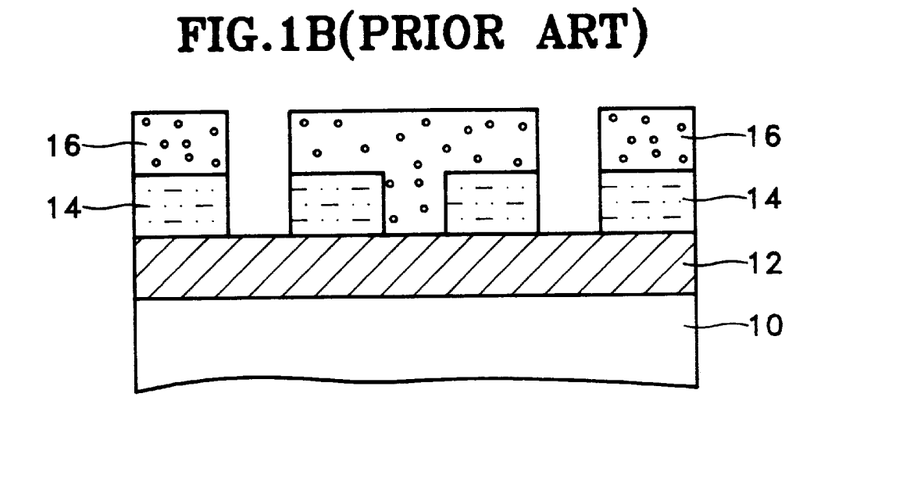

Referring to FIG. 1B, after removing the first photoresist pattern 16, a second photoresist pattern 18 for forming a contact hole is formed on the resultant structure. Subsequently, the interlevel dielectric film 14 and the insulating layer 12 are etched using the second photoresist pattern 18 as a mask.

Figure 1C:
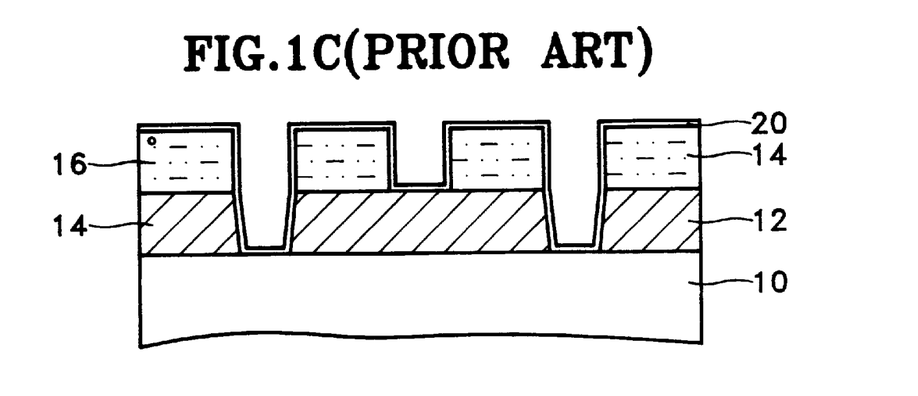

Referring to FIG. 1C, after removing the second photoresist pattern 18, titanium (Ti) and titanium nitride (TiN) are sequentially deposited on the resultant structure by a sputtering method or a CVD method to form an ohmic layer 19 and a barrier layer 20, respectively.

Figure 1D:
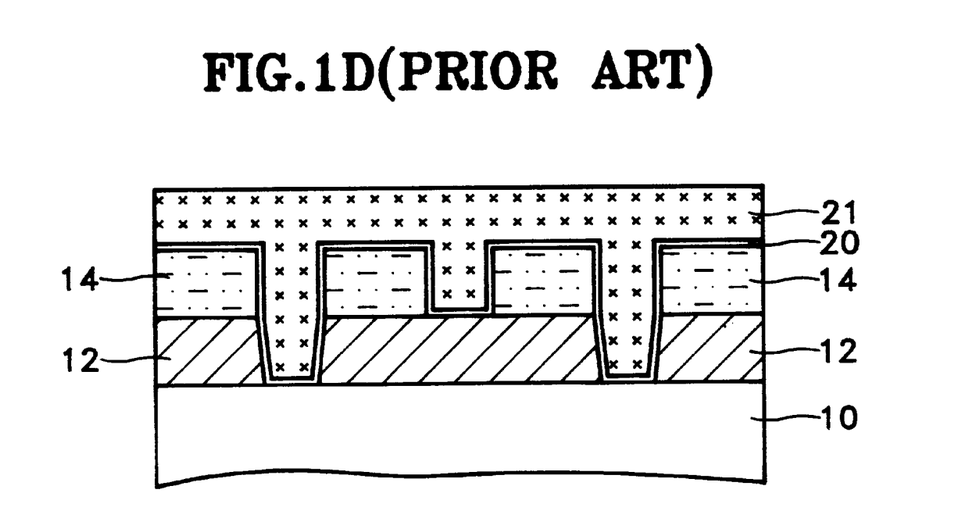

Referring to FIG. 1D, blanket-tungsten (W) is deposited on the resultant structure having the barrier layer 20 formed thereon by a CVD method to form a tungsten layer 21.

Figure 1E:
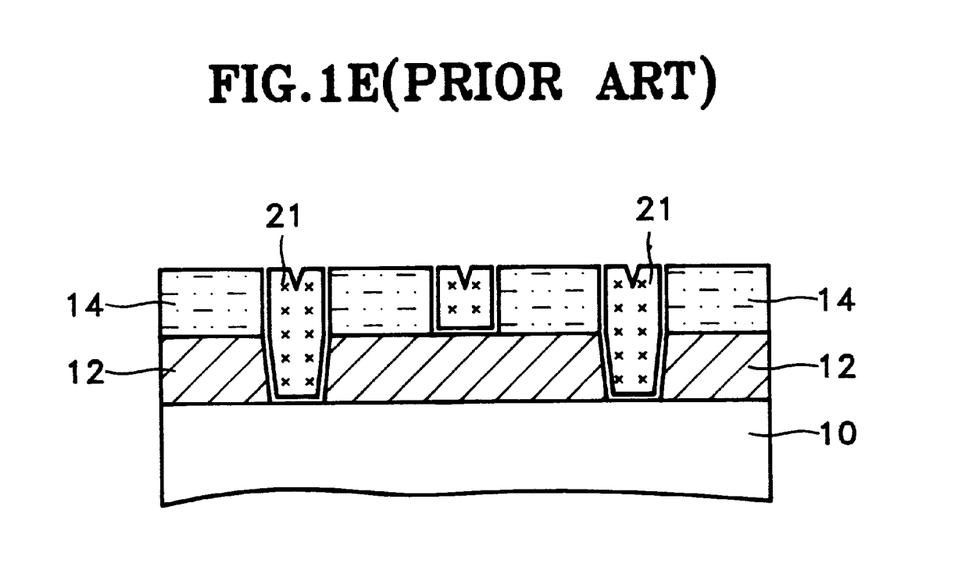

Referring to FIG. 1E, the tungsten layer 21 formed on the interlevel dielectric film 14 is etched by a chemical mechanical polishing (CMP) method, leaving filled metal contact holes and level tungsten wiring.

The aforementioned method for forming a metal wiring layer according to the conventional Dual Damascene technology involves several problems. First, since the specific resistance of tungsten used as a metal plug is higher than that of aluminum (Al: 2.7~3.3 $\mu\omega$cm, W: 5~6 $\mu\omega$cm), the metal wiring forming speed becomes slow. Second, since the grain of tungsten is grown in a columnar structure, a seam is formed within the contact hole due to an incoherence. Therefore, the etch rate becomes fast in the seam portion during a subsequent CMP process, thereby producing a V-shaped valley in the central portion of a tungsten metal plug or wire, as shown in FIG. 1E. Third, since tungsten is harder than aluminum, and since tungsten is deposited to a thickness of several thousand angstroms in order to compensate for its higher resistivity, when tungsten is etched by the CMP method the processing time is long compared with that for aluminum.

Attempts have been made to use a metal wiring layer of aluminum and aluminum contact plugs from that metal wiring layer to titanium contacts used on silicon devices to establish good ohmic contact. These attempts have included the use of a titanium nitride barrier layer over the titanium contacts for preventing the migration of aluminum into the silicon devices during subsequent high-temperature processing steps. The attempts have not been particularly successful, because voids tend to occur quite frequently in the aluminum metal wiring and contact hole portions. Accordingly, the use of aluminum for metal wiring layers and contact plugs has continued to be considered unacceptable for commercial manufacturing of semiconductor devices having a multiple-level wiring structure.

The inventor postulated that inhomogeneous growth of chemical-vapor-deposited aluminum on the TiN barrier layer is responsible for the voids in the aluminum metal wiring and contact hole portions. It was previously known in a general way that when CVD-Al is deposited on TiN film, CVD-Al having a very coarse surface is grown. This is because titanium has a catalytic function, but titanium for nucleation is present inhomogeneously at the surface of the TiN film. Since CVD-Al is more rapidly grown where titanium is present on the surface of TiN film and is less rapidly grown elsewhere, the growth becomes inhomogeneous, coarsening the surface of the CVD-Al. To avoid inhomogeneous growth of aluminum on the TiN barrier layer, the inventor reasoned, the amount of titanium present for nucleation at the surface of the TiN film must be made more uniform. The inventor reasoned that the preference would be to provide ample titanium over the entire surface of the TiN barrier layer to support homogeneous growth of CVD-Al, so the homogeneous growth of CVD-Al would be rapid.

SUMMARY OF THE INVENTION

The invention in a first of its aspects is directed to a method of forming, in a silicon semiconductor device, a metal wiring layer of chemical-vapor-deposited aluminum and at least one contact plug of chemical-vapor-deposited aluminum from that metal wiring layer to a lower-level titanium contact. Prior to the chemical-vapor-deposition of the aluminum the lower-level titanium contact has a titanium nitride barrier layer placed thereon, to prevent the migration of aluminum into the titanium contact and the silicon thereunder and to prevent the migration of silicon into the aluminum that is subsequently chemical-vapor-deposited. In order to avoid inhomogeneous growth of chemical-vapor-deposited aluminum as tends to introduce unwanted voids therein, the titanium nitride barrier layer is previously treated so as to be titanium-rich on the surface thereof on which aluminum is chemical-vapor-deposited.

More particularly, a preferred self-aligned method embodying the first aspect of the invention comprises the steps of: defining portions where a trench for metal wiring and a contact hole are to be formed on the insulating layer; forming a barrier layer on the defined resultant structure; electron-cyclotron-resonance (ECR) etching the barrier layer and without intervening exposure to the air exposing the etched barrier layer to a SiH$_4$ (silane) plasma; depositing aluminum in the metal wiring and contact hole portions using chemical vapor deposition; and removing the barrier layer extending above the surface of the insulating layer.

Alternatively, rather than using a self-aligned method to form the titanium contacts, the titanium contacts with their titanium nitride barrier layer treated so as to be titanium-rich on the surface thereof are placed on the silicon substrate before growing the insulating layer and etching contact holes therethrough.

The ECR etching may be performed using one of argon (Ar) gas, hydrogen (H$_2$) gas and gaseous mixture of Ar and H$_2$, and the ECR etching using Ar gas is preferably performed under the conditions of a bias voltage of –70V, a microwave power of 1000 kW and 2.45 GHz for no more than one minute. The SiH$_4$ plasma processing is preferably performed under the conditions of substrate temperature of 350° C. and power of 100 watts.

The aluminum depositing step is preferably performed in a CVD chamber using a lower pressure than atmospheric pressure. It is preferable to maintain the overall pressure in the CVD chamber to be no more than 1 torr. Also, the aluminum depositing step is preferably performed at a temperature no more than 350° C.

After the step of removing the barrier layer extending above the surface of the insulating layer, which can be done by chemical mechanical polishing, the preferred method embodying the first aspect of the invention can further comprise the steps of: forming, by physical deposition method, a metal layer on those portions of the structure still having aluminum deposited thereon; performing a thermal treatment on the whole surface of the resultant structure having the metal layer formed thereon for transforming the metal layer into an alloy layer; and the CMP materials that are removed including the metal layer, the thin silicon layer, the titanium nitride barrier layer and the titanium layer.

A material constituting the metal layer is preferably one selected from the group consisting of copper (Cu), titanium (Ti), palladium (Pd) and tungsten (W). The thermal treatment is preferably performed without the silicon semiconductor device being exposed to the air after forming the metal layer. At a temperature of 450~600° C. the thermal treatment is completed in no more than 10 minutes.

The invention in a second of its aspects is directed to a semiconductor device having a metal wiring layer of chemical-vapor-deposited aluminum and at least one contact plug of chemical-vapor-deposited aluminum from that metal wiring layer to a lower-level titanium contact, wherein the contact plug and the lower-level titanium contact are separated by a titanium nitride barrier layer treated so as to be titanium-rich on the surface thereof on which aluminum is chemical-vapor-deposited, so the chemical-vapor-deposited aluminum in the contact plug is homogeneously grown and free of voids therein.

BRIEF DESCRIPTION OF THE DRAWING

FIGS. 2A through 2G are cross-sectional views for explaining the methods for forming contact plugs and a buried metal wiring layer in a semiconductor device according to aspects of the invention.

DETAILED DESCRIPTION OF THE INVENTION

Figure 2A:
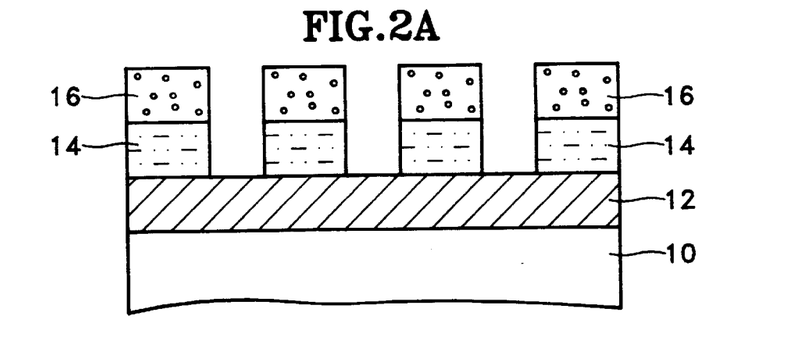

FIG. 2A illustrates forming the interlevel dielectric film 14 and selectively etching portions of the dielectric film 14 to provide a trench for metal wiring and the top portions of contact holes for accessing the surface of the silicon substrate. Insulating material, e.g., an oxide, is deposited on the silicon substrate 10 having a predetermined step difference structure (not shown) formed thereon to form the insulation layer 12. Thereafter, further insulation material, e.g., an oxide, is deposited thickly to form the interlevel dielectric film 14, so that a surface treatment can be performed to planarize the resultant structure having the insulation layer 12 formed therein,. Subsequently, a photoresist is coated on the interlevel dielectric film 14 and is exposed and developed to form a first photoresist pattern 16 for forming trenches for a buried metal wiring layer and the top portions of the contact holes to the silicon substrate or devices disposed in the surface of the silicon substrate. Next, the interlevel dielectric film 14 is etched using the first photoresist pattern 16 as a mask to define trenches for the buried metal wiring layer and the top portions of the contact holes.

Figure 2B:
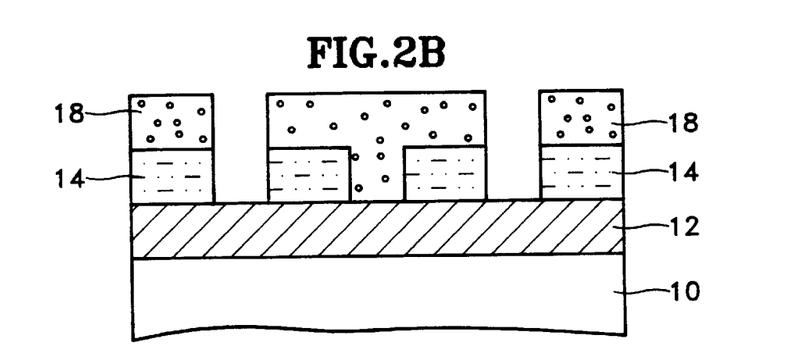

FIG. 2B illustrates selectively etching portions of the insulation layer 12 to complete the bottom portions of contact holes for accessing the surface of the silicon substrate. After removing the first photoresist pattern 16, the resultant structure is coated again with a photoresist that is exposed and developed to form a second photoresist pattern 18 for forming the bottom portions of the contact holes to the silicon substrate or devices disposed in the surface of the silicon substrate. Subsequently, the interlevel dielectric film 14 and the insulation layer 12 are etched using the second photoresist pattern 18 as a mask to compete the formation of the contact holes to the silicon substrate or devices disposed in the surface of the silicon substrate. (After their selective etching the interlevel dielectric film 14 and the insulation layer 12 are commonly considered as a unit and viewed as a single insulating layer.)

Figure 2C:
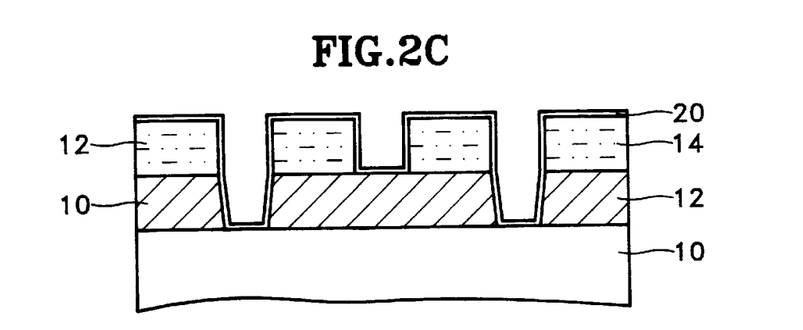

FIG. 2C illustrates the results of depositing an layer 19 forming ohmic contact with the surface of the silicon substrate 10 or devices formed therein, and then depositing an overlying barrier layer 20. After removing the second photoresist pattern 18, the defined wiring trenches and contact holes are cleansed with sulfuric acid (H$_2$SO$_4$) and diluted HF solution so that organic materials and a natural oxide layer present on the silicon substrate at the bottoms of the contact holes are removed. Subsequently, titanium (Ti) and titanium nitride (TiN) are sequentially deposited by a sputtering or CVD method, thereby forming the ohmic layer 19 for reducing a contact resistance and the barrier layer 20 for preventing the mutual diffusion in the interface between a plug to be formed in a later step and a silicon substrate. Next, the resultant structure is thermally treated in a furnace to form an enhanced barrier layer 20 of TiOxNy phase.

Figure 2D:
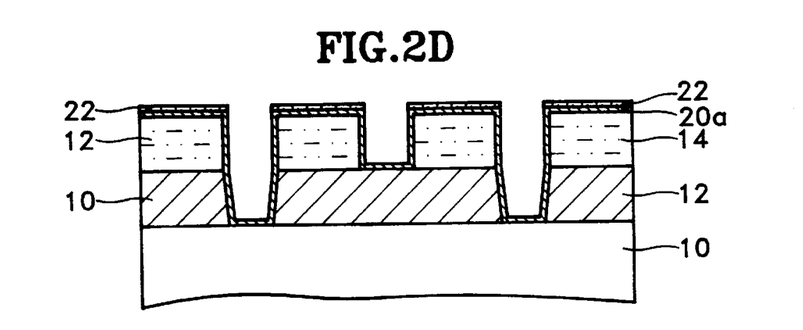

FIG. 2D illustrates the results of an ECR etching and a subsequent exposure to SiH$_4$ (silane) plasma. After depositing the barrier layer 20 comprised of a thin-film titanium nitride in a high-vacuum maintained sputtering chamber or a CVD chamber, the resultant structure is etched with an ECR plasma having an excellent directionality using Ar, $H_2$, or gas mixture of Ar and $H_2$. If the ECR etching is performed using Ar gas, it is performed under the conditions of a bias of −70V, and microwave power of 1000 kW and 2.45 GHz for no more than one minute. The ECR etching smoothes the surface of the barrier layer 20 present in the side walls and bottoms of the wiring trench and contact hole portions and simultaneously forms a titanium-rich top surface 20a on the titanium nitride layer. This results, in accordance with the invention, in a homogeneous nucleation throughout the side walls and bottoms of the wiring trench and contact hole portions for the subsequent chemical-vapor-deposition of aluminum. The bottom surface of the titanium nitride layer remains substantially in its original state, being relatively titanium-poor so as to provide a barrier both to migration of aluminum and to migration of silicon.

The following table shows the composition of TiN before and after ECR etching process, as determined using X-ray photoelectron spectroscopy (XPS) surface analysis.

| Sample | Atomic percent (%) | | Atomic ratio |
| --- | --- | --- | --- |
| | Titanium | Nitrogen | Ti:N |
| As-deposited TiN | 44.6 | 46 | 0.97:1 |
| ECR-treated TiN | 49.2 | 40.8 | 1:21:1 |

It is discernible from the table that the relative amount of Ti on the TiN film surface was increased by the Ar-ECR etching, performed after depositing the TiN.

Then, after performing the ECR etching, the resultant structure is continuously exposed to $SiH_4$ plasma for several tens of seconds without being exposed to the air. At this time, a receptacle in which the silicon substrate is disposed is heated to a temperature of 350° C. and 100 watt power is applied thereto. Since $SiH_4$ plasma contacts only the surface having a relatively wide exposed area but does not contact relatively narrow exposed areas, i.e., the side walls and bottoms of wiring trench and contact hole portions, a thin silicon layer 22 is formed on the top surface 20a of the barrier layer 20 except for these wiring trench and contact hole portions.

Figure 2E:
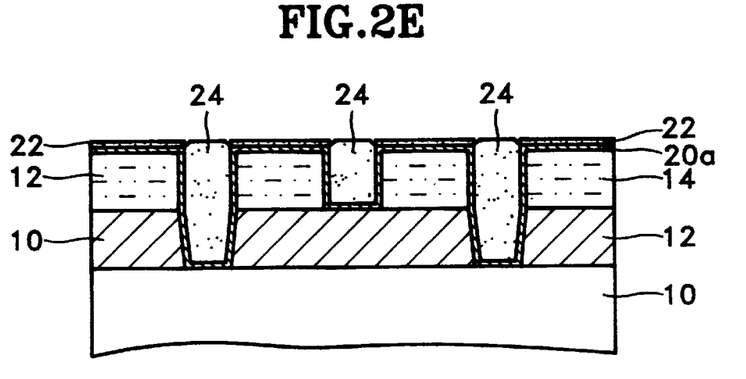

FIG. 2E illustrates the forming of a CVD-Al plug 24. The $SiH_4$ plasma processed resultant structure is put into a CVD-Al deposition chamber in which a high-vacuum state is maintained, and then Al-source gas, e.g., dimethyl aluminum hydride (DMAH) or DMAH containing 5% trimethyl aluminum (TMA), is induced together with carrier gas $H_2$ at a temperature no higher than 320° C. for no more than several minutes. As a result of the nucleation afforded by the titanium at the bottoms and sidewalls of the wiring trenches and contact hole portions of the structure, Al grows rapidly from them. Accordingly, CVD-Al plugs 24 selectively form only within the metal wiring and contact hole portions Al growth from the portions of the structure which are covered by the thin silicon layer 22 is relatively slow, and is overtaken as the wiring trenches and contact hole portions of the structure fill.

Figure 2F:
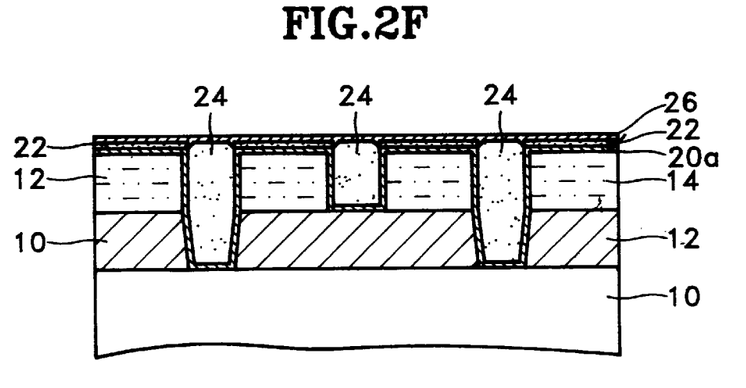

FIG. 2F illustrates forming a metal layer 26. Even if only a metal wiring is present, since the barrier layer 20a surrounds the side wall of metal wiring portion, excellent reliability is secured from the metal wiring formed only with pure Al even without doping Si or Cu. However, if necessary, the resultant structure having the CVD-Al plug 24 formed thereon is moved, without being exposed to the air, into a sputtering chamber to have a Cu-thin film to a thickness of no more than 100 Å deposited thereon. Also, a higher temperature treatment is performed at 450° C. for no longer than 5 minutes to diffuse the Cu and the surrounding Si into the CVD-Al, thereby forming an Al—Si—Cu alloy plug 24a.

Figure 2G:
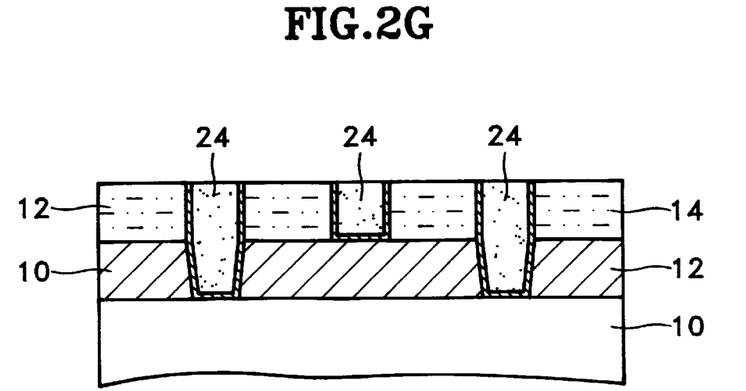
FIG. 2G illustrates a portion of a semiconductor device embodying the invention in one of its aspects.

FIG. 2G illustrates removing the material layers present on the interlevel dielectric film 14. In more detail, the thin silicon layer 22 formed by $SiH_4$ plasma processing, the metal layer 26 and a portion of the barrier layer 20a are removed by CMP method.

Figure 3A:
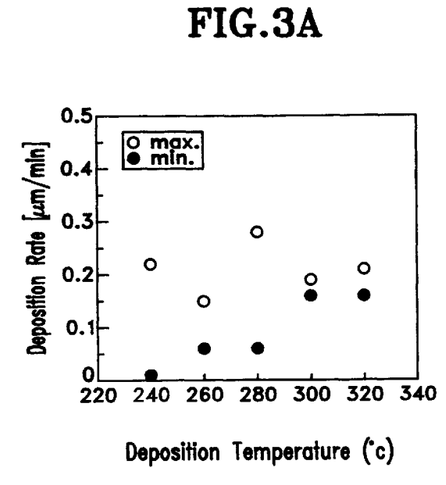
FIGS. 3A through 3D are graphs showing deposition characteristics of CVD-Al depending on the method of processing titanium nitride (TiN) and underlying layers, respectively.
Figure 3B:
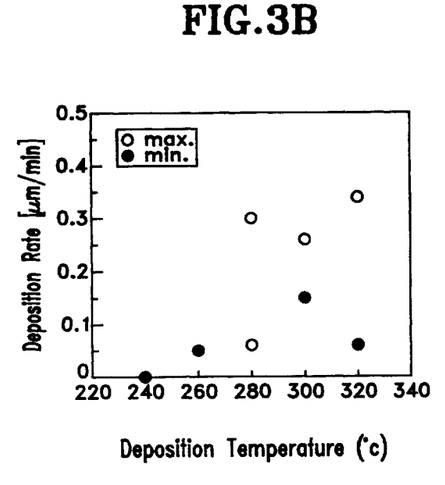
Figure 3C:
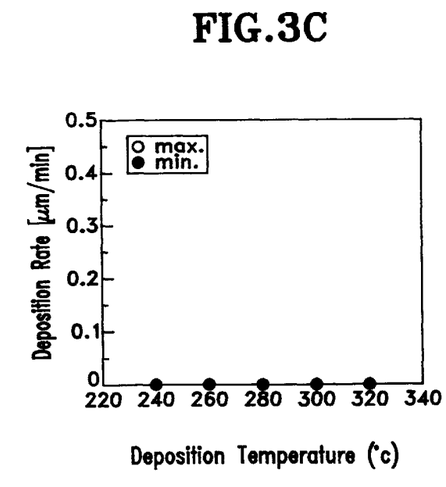
Figure 3D:
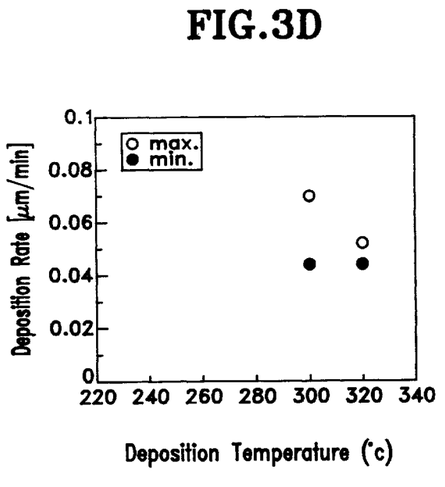

FIGS. 3A through 3D are graphs showing deposition characteristics of CVD-Al depending on the method of processing titanium nitride (TiN) and underlying layers, respectively. FIG. 3A shows the case of depositing TiN, FIG. 3B shows the case of performing a thermal treatment in a furnace at 450° C. for 30 minutes after the TiN deposition, FIG. 3C shows the case of performing $SiH_4$ plasma processing at 350° C. for 30 seconds with 100 W after the thermal treatment, and FIG. 3D shows the case of a single crystalline silicon layer of a (111) direction.

As shown in FIGS. 3A through 3D, if the deposition temperature of CVD-Al is increased from 240° C. to 320° C., CVD-Al was grown on TiN film, irrespective of temperature (FIGS. 3A and 3B), but, CVD-Al was grown on single crystalline silicon layer only at temperatures at least a critical value (FIG. 3D). However, in the case of $SiH_4$ plasma processing, CVD-Al was not deposited below 320° C. but was grown with small grain size at a temperature of at least 320° C. (FIG. 3C).

As described above, according to the method for forming metal wiring layer in a semiconductor device, an ECR etching surface treatment is performed to smooth the surface of the side walls of metal wiring and contact hole portions and to allow Al nucleation and growth to occur uniformly and rapidly. Then, a $SiH_4$ plasma processing is performed to prohibit Al from growing in residual regions except the metal wiring and contact hole portions. Therefore, a metal wiring layer free of voids can be formed.

The process that has been described is self-aligning in nature with the deposition of the titanium, the titanium nitride barrier layer, and the aluminum being over the entire surface of the semiconductor device structure. Since the steps shown in FIGS. 2C through 2F are continuously performed, these steps can be performed without a throughput delay in the commonly used manufacturing set-up in which CVD and sputtering chambers are clustered together. In an alternative method embodying the invention, the titanium contacts to the surface of the silicon substrate (or to devices disposed therein) and the overlying titanium nitride barrier can be formed prior to the formation of the insulating layer that is selectively etched to form the trenches for the metal wiring layer and the contact holes for the contact plugs. This alternative method includes further masking steps, however.

The inventive concept of providing a barrier layer with a metal-rich surface on which to grow aluminium homogeneously from a vapor phase to form a wiring layer and contact plugs presumably extends to various oxides or nitrides of refractory metals. The method of the invention can also be applied where the formation of contact plugs to the silicon substrate or to devices disposed therein is the primary concern and where the formation of wiring layer in trenches is not of particular concern; e. g., where the contact plugs connect to a top wiring layer that is disposed on the top surface of the insulating layer, rather than in a trench structure in the top surface of the insulating layer.

The present invention is not limited to the preferred embodiment, then, and various changes within the spirit of the invention may be effected by one skilled in the art and acquainted with the foregoing disclosure; this should be borne in mind when construing the scope of the claims which follow.

What is claimed is:

1. A method for forming metal wiring layer on a semiconductor substrate having an insulating layer formed thereon, said method comprising the steps of:

defining portions where a metal wiring and a contact hole are to be formed on said insulating layer;

forming a barrier layer on the resultant structure having said defined metal wiring and contact hole portions;

performing $SiH_4$ plasma processing on the resultant structure having said barrier layer formed thereon to form a silicon layer on the surface of said barrier layer except where it extends substantially into said metal wiring and contact hole portions; and depositing aluminum only within said metal wiring and contact hole portions.

2. A method for forming a contact plug on a semiconductor device having a silicon substrate with a surface over which an insulating layer is formed, said method comprising the steps of:

selectively etching portions of said insulating layer to provide a contact hole for accessing said surface of said silicon substrate;

depositing a barrier layer on a structure resulting form the foregoing step of selectively etching;

depositing a silicon layer on said barrier layer except where it extends substantially into said contact hole, using $SiH_4$ plasma processing; and depositing aluminum within said contact hole using chemical vapor deposition (CVD).

3. The method for forming a contact plug claimed in claim 2, wherein said $SiH_4$ plasma processing is performed under the conditions of substrate temperature of 350° C. and power of 100 watts.

4. A method for forming a metal wiring layer on a semiconductor device having a silicon substrate with a surface over which an insulating layer is formed, said method comprising the steps of:

selectively etching portions of said insulating layer to provide a trench for metal wiring and a contact hole for accessing said surface of said silicon substrate;

depositing a barrier layer on a structure resulting from the foregoing step of selectively etching;

depositing a silicon layer on said barrier layer except where it extends substantially into said contact hole, using $SiH_4$ plasma processing;

depositing aluminum within said trench for metal wiring and within said contact hole using chemical vapor deposition (CVD); and removing materials extending onto the surface of said insulating layer, said materials that are removed including said silicon layer and said barrier layer.

5. The method for forming a metal wiring layer claimed in claim 4, wherein said $SiH_4$ plasmid processing is performed under the conditions of substrate temperature of 350° C. and power of 100 watts.

6. The method for forming a metal wiring layer claimed in claim 3, wherein the following steps are performed following said step of depositing aluminum:

forming a metal layer on a structure resulting from the claim 3 method, using a physical deposition method; and performing a thermal treatment on the surface of a resultant structure resulting from the foregoing step of forming said metal layer for transforming said metal layer into an alloy layer;

wherein said step of removing materials comprises the step of removing materials extending onto the surface of said insulating layer, said materials that are removed including said metal layer, said silicon layer, and said barrier layer.

7. The method for forming a metal wiring layer claimed in claim 6, wherein said step of performing a thermal treatment is performed after said step of forming a metal layer without intervening exposure of said metal layer to air, said thermal treatment being performed at a temperature of 450~600° C. in no more than 10 minutes.

8. The method for forming a metal wiring layer claimed in claim 6, wherein a material constituting said metal layer is one selected from the group consisting of copper (Cu), titanium (Ti), palladium (Pd) and tungsten (W).

9. The method for forming a metal layer on a semiconductor substrate as claimed in claim 1, further comprising, after forming said barrier layer, a step of performing an electron-cyclotron-resonance (ECR) etching on the surface of the resultant structure having said barrier layer formed thereon.

10. The method for forming a metal layer on a semiconductor substrate as claimed in claim 9, further comprising, after depositing said aluminum, a step of removing material layers on the surface of said insulating layer, said material layers including said barrier layer and said silicon layer formed by said $SiH_4$ plasma processing.

11. The method for forming a metal layer on a semiconductor substrate as claimed in claim 1, further comprising, after depositing said aluminum, a step of removing material layers on the surface of said insulating layer, said material layers including said barrier layer and said silicon layer formed by said $SiH_4$ plasma processing.

12. The method for forming a metal layer on a semiconductor substrate as claimed in claim 11, wherein said step of removing material layers on the surface of said insulating layer is performed by chemical mechanical polishing.

13. The method for forming a metal layer on a semiconductor substrate as claimed in claim 1, further comprising, after depositing said aluminum, a step of depositing a copper layer on a structure resulting from the forgoing step of depositing said aluminum, wherein said step of depositing said copper layer is performed without breaking vacuum.

14. The method for forming a metal layer on a semiconductor substrate as claimed in claim 13, further comprising, after depositing said copper layer, a step of thermal treatment to form a Si—Cu—Al alloy layer on the surface of said aluminum layer.

15. The method for forming a metal layer on a semiconductor substrate as claimed in claim 1, wherein said barrier layer is formed TiN or Ti/TiN.

16. The method for forming a contact plug on a semiconductor device as claimed in claim 2, further comprising, after forming said barrier layer, a step of performing an electron-cyclotron-resonance (ECR) etching on the surface of the resultant structure having said barrier layer formed thereon.

17. The method for forming a contact plug on a semiconductor device as claimed in claim 16, further comprising, after depositing said aluminum, a step of removing material layers on the surface of said insulating layer, said material layers including said barrier layer and said silicon layer formed by said $SiH_4$ plasma processing.

18. The method for forming a contact plug claimed in claim 16, wherein said step of ECR etching is performed using one of argon (Ar) gas, hydrogen ($H_2$) gas and gas mixture of Ar and $H_2$.

19. The method for forming a contact plug claimed in claim 16, wherein said step of ECR etching is performed using Ar gas, using a bias voltage of −70V, and applying 1000 kW of 2.45 GHz microwave power for no more than one minute.

20. The method for forming a contact plug on a semiconductor device as claimed in claim 2, further comprising, after depositing said aluminum, a step of removing material layers on the surface of said insulating layer, said material layers including said barrier layer and said silicon layer formed by said $SiH_4$ plasma processing.

21. The method for forming a contact plug on a semiconductor substrate as claimed in claim 20, wherein said step of removing material layers on the surface of said insulating layer is performed by chemical mechanical polishing.

22. The method for forming a contact plug on a semiconductor substrate as claimed in claim 2, further comprising, after depositing said aluminum, a step of depositing a copper layer on a structure resulting from the forgoing step of depositing said aluminum, wherein said step of depositing said copper layer is performed without breaking vacuum.

23. The method for forming a contact plug on a semiconductor substrate as claimed in claim 22, further comprising, after depositing said copper layer, a step of thermal treatment to form a Si—Cu—Al alloy layer on the surface of said aluminum layer.

24. The method for forming a contact plug on a semiconductor substrate as claimed in claim 2, wherein said barrier layer is formed of TiN or Ti/TiN.

25. The method for forming a metal layer on a semiconductor device as claimed in claim 3, further comprising, after forming said barrier layer, a step of performing an electron-cyclotron-resonance (ECR) etching on the surface of the resultant structure having said barrier layer formed thereon.

26. The method for forming a metal wiring layer claimed in claim 23, wherein said step of ECR etching is performed using one of argon (Ar) gas, hydrogen ($H_2$) gas and gas mixture of Ar and $H_2$.

27. The method for forming a metal wiring layer claimed in claim 3, wherein said step of ECR etching is performed using Ar gas, using a bias voltage of −70V, and applying 1000 kW of 2.45 GHz microwave power for no more than one minute.

28. The method for forming a metal layer on a semiconductor device as claimed in claim 3, wherein said step of removing material layers extending onto the surface of said insulating layer is performed by chemical mechanical polishing.

29. The method for forming a metal layer on a semiconductor device as claimed in claim 3, further comprising, after depositing said aluminum, a step of depositing a copper layer on a structure resulting from the forgoing step of depositing said aluminum, wherein said step of depositing said copper layer is performed without breaking vacuum.

30. The method for forming a metal layer on a semiconductor device as claimed in claim 29, further comprising, after depositing said copper layer, a step of thermal treatment to form a Si—Cu—Al alloy layer on the surface of said aluminum layer.

31. The method for forming a metal layer on a semiconductor substrate as claimed in claim 3, wherein said barrier layer is formed of TiN or Ti/TiN.

* * * * *